(12) United States Patent
Sbuell (10) Patent No.: US 8,854,134 B2
(45) Date of Patent: Oct. 7, 2014

(54) CHIP CARD

(75) Inventor: Richard Sbuell, Graz (AT)

(73) Assignee: Infineon Technologies AG, Neubiberg (DE)

( * ) Notice: Subject to any disclaimer, the term of this patent is extended or adjusted under 35 U.S.C. 154(b) by 86 days.

(21) Appl. No.: 13/598,701

(22) Filed: Aug. 30, 2012

(65) Prior Publication Data
US 2014/0062594 A1 Mar. 6, 2014

(51) Int. Cl.
*H03F 3/45* (2006.01)
(52) U.S. Cl.
USPC .......................................... 330/255; 330/258
(58) Field of Classification Search
CPC ......................................................... H03F 3/45
USPC .................................. 330/255, 258, 261, 277
See application file for complete search history.

(56) References Cited

U.S. PATENT DOCUMENTS

| | | | | |
|---|---|---|---|---|
| 6,362,606 B1 * | 3/2002 | Dupuis et al. | ................. | 323/272 |
| 7,298,211 B2 * | 11/2007 | Akama | ......................... | 330/267 |

* cited by examiner

*Primary Examiner* — Robert Pascal
*Assistant Examiner* — Khiem Nguyen (57) ABSTRACT

According to an embodiment, a chip card is provided comprising a signal source configured to generate a signal to be transmitted via radio, a p-channel field effect transistor and being coupled with its source terminal to an upper supply potential and with its drain terminal to a common node; an n-channel field effect transistor and being coupled with its drain terminal to the common node and with its source terminal to a lower supply potential; an operational amplifier having a positive input terminal, a negative input terminal and an output terminal, wherein the positive input terminal is coupled to the common node, the negative input terminal is coupled to the signal source and the output terminal is coupled to the gate terminal of the p-channel field effect transistor and to the gate terminal of the n-channel field effect transistor; and an antenna coupled to the common node.

13 Claims, 10 Drawing Sheets

CHIP CARD

TECHNICAL FIELD

The present disclosure relates to chip cards.

BACKGROUND

In chip card applications, there are typically limitations regarding the value of the available supply voltage. Since voltage difference between a high voltage output and a low voltage output of an amplifier which is supplied with such a limited supply voltage is correspondingly limited by the maximum value of the supply voltage, it is desirable that the voltage difference that is achieved is as near as possible to this limit

SUMMARY

According to an embodiment, an chip card is provided including a signal source configured to generate a signal to be transmitted via radio; a p-channel field effect transistor having a gate terminal, a source terminal and a drain terminal and being coupled with its source terminal to an upper supply potential and with its drain terminal to a common node; an n-channel field effect transistor having a gate terminal, a source terminal and a drain terminal and being coupled with its drain terminal to the common node and with its source terminal to a lower supply potential; an operational amplifier having a positive input terminal, a negative input terminal and an output terminal, wherein the positive input terminal is coupled to the common node, the negative input terminal is coupled to the signal source and the output terminal is coupled to the gate terminal of the p-channel field effect transistor and to the gate terminal of the n-channel field effect transistor; and an antenna coupled to the common node.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. These aspects of this disclosure are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
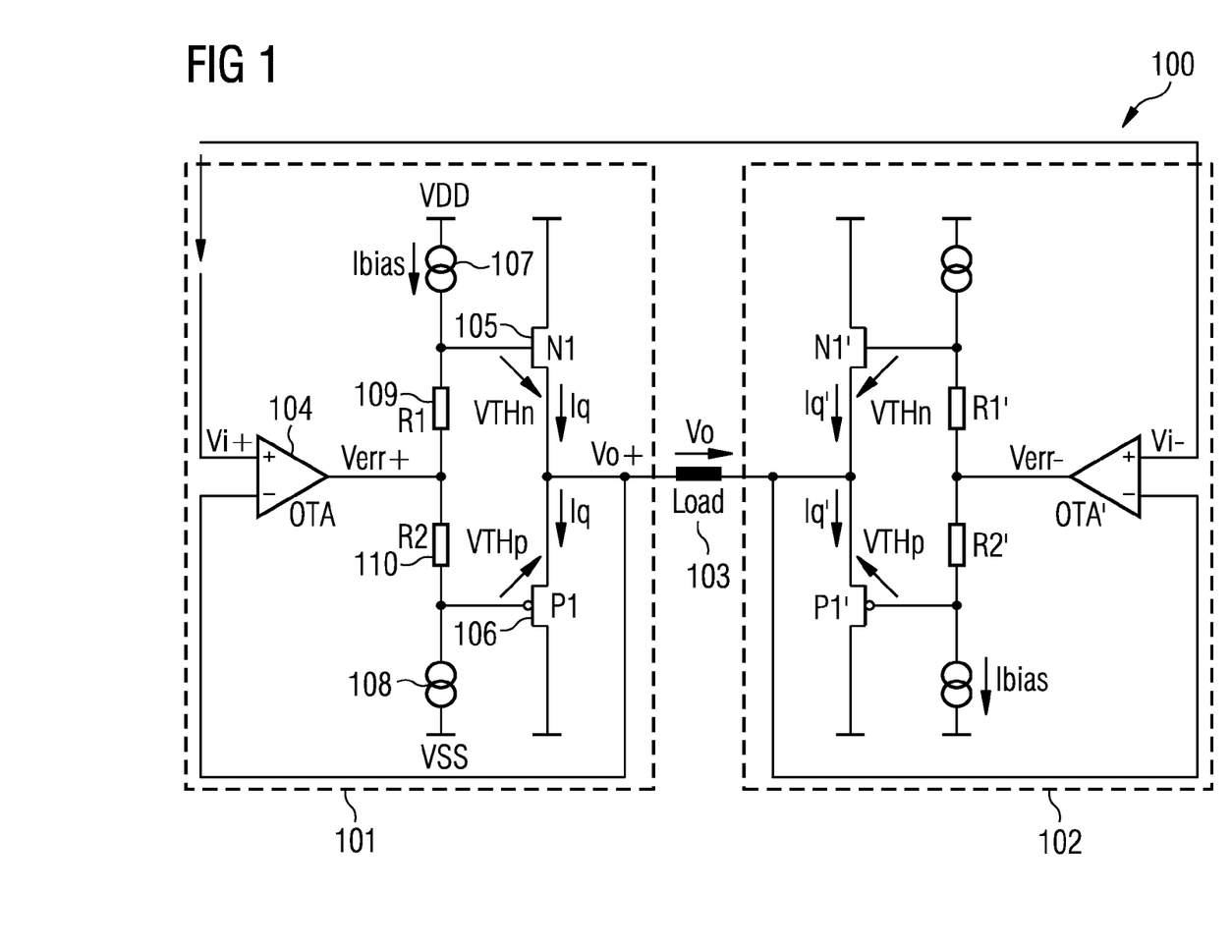
FIG. 1 shows an amplifier circuit.

FIG. 1 shows an amplifier circuit 100.

In this example, the amplifier circuit 100 is a push-pull (class AB) differential amplifier circuit which can also be seen as a differential driver for a load 103, e.g. an antenna.

The amplifier circuit 100 includes a first single ended amplifier circuit 101 and a second single ended amplifier circuit 102.

The first single ended amplifier circuit 101 which can be seen as a single ended stage can thus be seen to be implemented by an error amplifier (in this example OTA 104) and a push-pull complementary output stage (formed by the n-channel field effect transistor 105 and the p-channel field effect transistor 106). The error amplifier compares the input voltage Vi+ (or Vi− for the second single ended amplifier circuit 102) with the output voltage Vo+ (or Vo− for the second single ended amplifier circuit 102) and adjusts the output voltage of the error amplifier Verr+ (or Verr− for the second single ended amplifier circuit 102) in a way such that Vo+ (or Vo− for the second single ended amplifier circuit 102) is matching to Vi+ (or Vi− for the second single ended amplifier circuit 102). The differential output voltage of the amplifier circuit 100 Vo is given by Vo+−Vo−=Vi=Vi+−Vi−.

Since the first single ended amplifier circuit 101 and the second single ended amplifier circuit 102 have a similar structure, only the first single ended amplifier circuit 101 is described in the following.

The first single ended amplifier circuit 101 includes an operational transconductance amplifier (OTA) 104 whose positive input is the input of the first single ended amplifier circuit 102 and whose negative input is coupled to the output of the first single ended amplifier circuit 102. The first single ended amplifier circuit 101 further includes an n-channel field effect transistor 105 whose drain is coupled to the upper supply potential (i.e. the supply voltage) VDD and whose source is coupled to the output of the first single ended amplifier circuit 101. The first single ended amplifier circuit 101 further includes a p-channel field effect transistor 106 whose source is coupled to the output of the first single ended amplifier circuit 101 and whose drain is coupled to the lower supply potential VSS.

The first single ended amplifier circuit 101 further includes a first current source 107 which is coupled between VDD and the gate of the n-channel field effect transistor 105 and a second current source 108 which is coupled between VSS and the gate of the p-channel field effect transistor 106.

The first single ended amplifier circuit 101 further includes a first resistor 109 coupled between the output of the OTA 104 and the gate of the n-channel field effect transistor 105 and a second resistor 110 coupled between the output of the OTA 104 and the gate of the p-channel field effect transistor 106.

The first single ended amplifier circuit 101 which can be seen as a single ended stage can thus be seen to be implemented by an error amplifier (in this example OTA 104) and a push-pull complementary output stage (formed by the n-channel field effect transistor 105 and the n-channel field effect transistor 106). The error amplifier compares the input voltage Vi+ (or Vi− for the second single ended amplifier circuit 102) with the output voltage Vo+ (or Vo− for the second single ended amplifier circuit 102) and adjusts the output voltage of the error amplifier Verr+ (or Verr− for the second single ended amplifier circuit 102) in a way such that Vo+ (or Vo− for the second single ended amplifier circuit 102)

is matching to Vi+ (or Vi− for the second single ended amplifier circuit 102). The differential output voltage of the amplifier circuit 100 Vo is given by Vo+−Vo−=Vi=Vi+−Vi−.

The quiescent current Iq in the output stage is adjusted by the voltage drop across the first resistor 109 R1 and the second resistor 110 R2 and therefore by the bias current $I_{bias}$. provided by the first current source 107 and the second current source 108. For minimizing the quiescent current the bias current can be adjusted in a way so that the voltage drop Ibias×(R1+R2) is slightly larger than VTHn+VTHp.

If, as shown in the of FIG. 1 example, the first single ended amplifier circuit 101 is supplied by VDD without an additional charge pump the output voltage of the push-pull output stage is limited to about VDD−$V_{THn}$ (for the high level output voltage) and VSS+$V_{THp}$ (for the low level output voltage), wherein $V_{THn}$ is the threshold voltage of the n-channel field effect transistor 105 and $V_{THp}$ is the threshold voltage of the p-channel field effect transistor 106.

This means that if the sum of VTHn+VTHp is close to VDD which may be the case in low power circuits architectures, for example used in the field of contact-less chip cards, the output voltage range given by VDD−VTHn−VTHp−VSS may be very limited.

According to one embodiment, a concept for a push pull differential amplifier circuit for a chip card is working at a very low power supply voltage (even if the sum of $V_{THn}$+$V_{THp}$ is close to VDD) is provided by maintaining high efficiency and circuit stability needed for driving heavy inductive loads (e.g. antennas).

Figure 2:
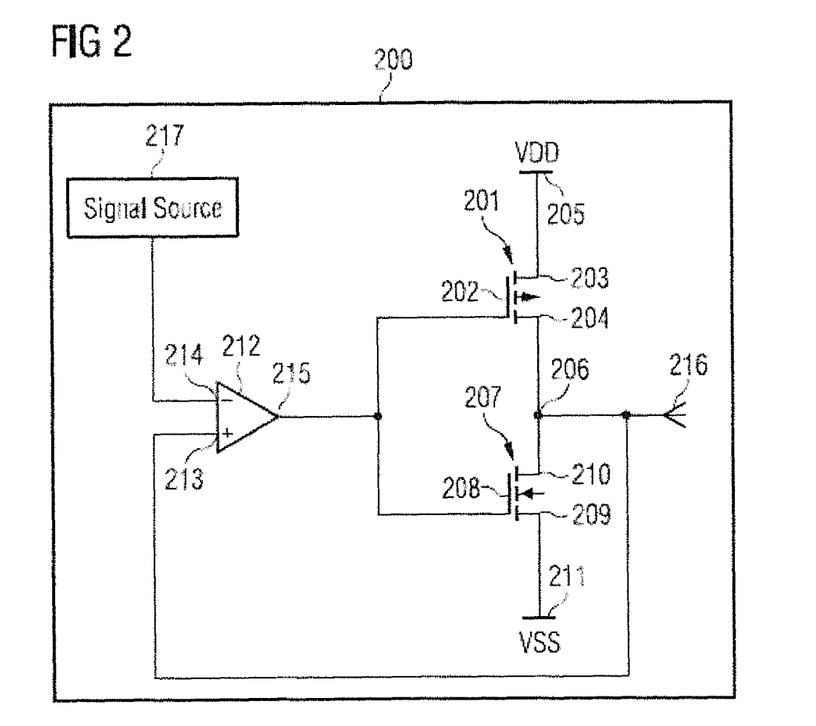
FIG. 2 shows a chip card according to an embodiment.

An example for a chip card according to an embodiment is given in FIG. 2.

FIG. 2 shows a chip card 200.

The chip card 200 includes a signal source 217 configured to generate a signal to be transmitted via radio.

The chip card 200 further includes a p-channel field effect transistor 201 having a gate terminal 202, a source terminal 203 and a drain terminal 204 and being coupled with its source terminal 203 to an upper supply potential 205 (e.g. $V_{DD}$) and with its drain terminal 204 to a common node 206.

The chip card 200 further includes an n-channel field effect transistor 207 having a gate terminal 208, a source terminal 209 and a drain terminal 210 and being coupled with its drain terminal 210 to the common node 206 and with its source terminal 209 to a lower supply potential 211 (e.g. $V_{SS}$).

The chip card 200 further includes an operational amplifier 212 having a positive input terminal 213, a negative input terminal 214 and an output terminal 215, wherein the positive input terminal 213 is coupled to the common node 206, the negative input terminal 214 is coupled to the signal source 217 and the output terminal 215 is coupled to the gate terminal 202 of the p-channel field effect transistor 201 and to the gate terminal 208 of the n-channel field effect transistor 207 and an antenna 216 coupled to the common node 206.

According to one embodiment, in other words, a chip card (e.g. a contactless chip card) is provided that has a push-pull output stage formed by an n-channel field effect transistor (e.g. an NMOS) coupled to the high supply potential (e.g. VDD) and a p-channel field effect transistor (e.g. a PMOS) coupled to the low supply potential. For example, compared to the chip card 100 shown in FIG. 1, the NMOS and PMOS transistors of the output stages of the single ended chip cards 101, 102 are reversed (such that the source terminal of the PMOS device is connected to VDD and the source of the NMOS device is connected to VSS).

This structure of the chip card 200 allows it to work at very low supply voltages (e.g. close to the sum of VTHn+VTHp) and can for example (almost) provide a rail to rail output voltage range. The chip card 200 can is implemented with the operational amplifier without needing a charge pump for supplying the operational amplifier such that the whole chip card 200 can be implemented by using low voltage devices.

The circuit comprising the operational amplifier 212, the p-channel field effect transistor 201 and the n-channel field effect transistor 207 may be seen as an amplifier circuit for amplifying the signal to be transmitted and for driving the antenna 216.

According to one embodiment, the efficiency of the amplifier circuit, which is used as output driver for the antenna 216, is maximized by a control loop which minimizes the quiescent current in an output stage (e.g. in the complementary output stages when it is implemented as a differential amplifier) in dependency of the driver's load and characteristic of the input signal applied. This approach can for example be used for driving a transmit antenna integrated in a contact-less chip-card since the load impedance and the input signal characteristic typically do not (or only little) change over time. Due to this fact calibration can be performed once (e.g. while powering up the chip-card). When a different antenna is connected to the chip-card the chip card can adapt automatically for reaching best efficiency.

According to one embodiment, the stability of the driver is maintained by adding a pole zero compensation circuit to the output stage or output stages (e.g. to the complementary output stages in case of an implementation as differential amplifier).

The p channel field effect transistor 201 and the n channel field effect transistor 207 may be of depletion or enhancement type and may be field effect transistors of various types such as MOSFETS (metal oxide semiconductor field effect transistors), MESFETS (metal semiconductor field effect transistors) and so on.

In one embodiment, the operational amplifier is an operational transconductance amplifier.

According to one embodiment, the gate of the p-channel field effect transistors and the gate of the n-channel field effect transistor are coupled by at least one of a resistor and a capacitor.

The chip card may further include a pole-zero compensation circuit coupled between the gate of the p-channel field effect transistor, the gate of the n-channel field effect transistor and the common node.

The operational amplifier, the p-channel field effect transistor and the n-channel field effect transistor for example form a first amplifier stage and the chip card may further include a second amplifier stage.

The second amplifier stage for example includes a further p-channel field effect transistor having a gate terminal, a source terminal and a drain terminal and being coupled with its source terminal to the upper supply potential and with its drain terminal to a further common node; a further n-channel field effect transistor having a gate terminal, a source terminal and a drain terminal and being coupled with its drain terminal to the further common node and with its source terminal to the lower supply potential; a further operational amplifier having a positive input terminal, a negative input terminal and an output terminal, wherein the positive input terminal is coupled to the further common node, the negative input terminal is coupled to the signal source and the output terminal is coupled to the gate terminal of the further p-channel field effect transistor and coupled to the gate terminal of the further n-channel field effect transistor, wherein the antenna is coupled to the further common node. The second amplifier stage may be similar to the first amplifier stage and may thus also have the features (like the pole compensation circuit) as described above.

The antenna is for example coupled between the common node and the further common node.

The signal is for example a differential signal and the signal source is configured to supply a positive component of the signal to the negative input of the operational amplifier and to supply a negative component of the signal to the negative input of the further operational amplifier. The differential signal is the signal to be amplified, e.g. a transmit signal such as a modulated carrier signal.

The chip card may further include a first bias current source coupled between the higher supply potential and the gate of the p-channel field effect transistor and a second bias current source coupled between the lower supply potential and the gate of the re-channel field effect transistor.

According to one embodiment, the chip card further including a quiescent current controller configured to control the first bias current source and the second bias current source based on a quiescent current reduction criterion.

The quiescent current controller is for example configured to determine the quiescent current through the p-channel field effect transistor and the n-channel field effect transistor and to control the first bias current source and the second bias current source based on the determined quiescent current.

The quiescent current controller is for example configured to control the first bias current source and the second bias current source based on a comparison of the determined quiescent current and a current reference.

For example, the quiescent current controller is configured to determine a magnitude of the current to be supplied by the first bias current source and the second bias current source based on the result of the comparison.

The chip card is for example configured to operate in a calibration mode in which the quiescent current controller determines the magnitude of the current to be supplied by the first bias current source and the second bias current source and is for example configured to switch, after the determination of the magnitude of the current to be supplied by the first bias current source and the second bias current source, to an amplifying mode in which the quiescent current controller controls the first bias current source and the second bias current source to provide the current of the determined magnitude.

In the following, an example for an amplifier circuit for a chip card according to an embodiment is described in more detail.

Figure 3:
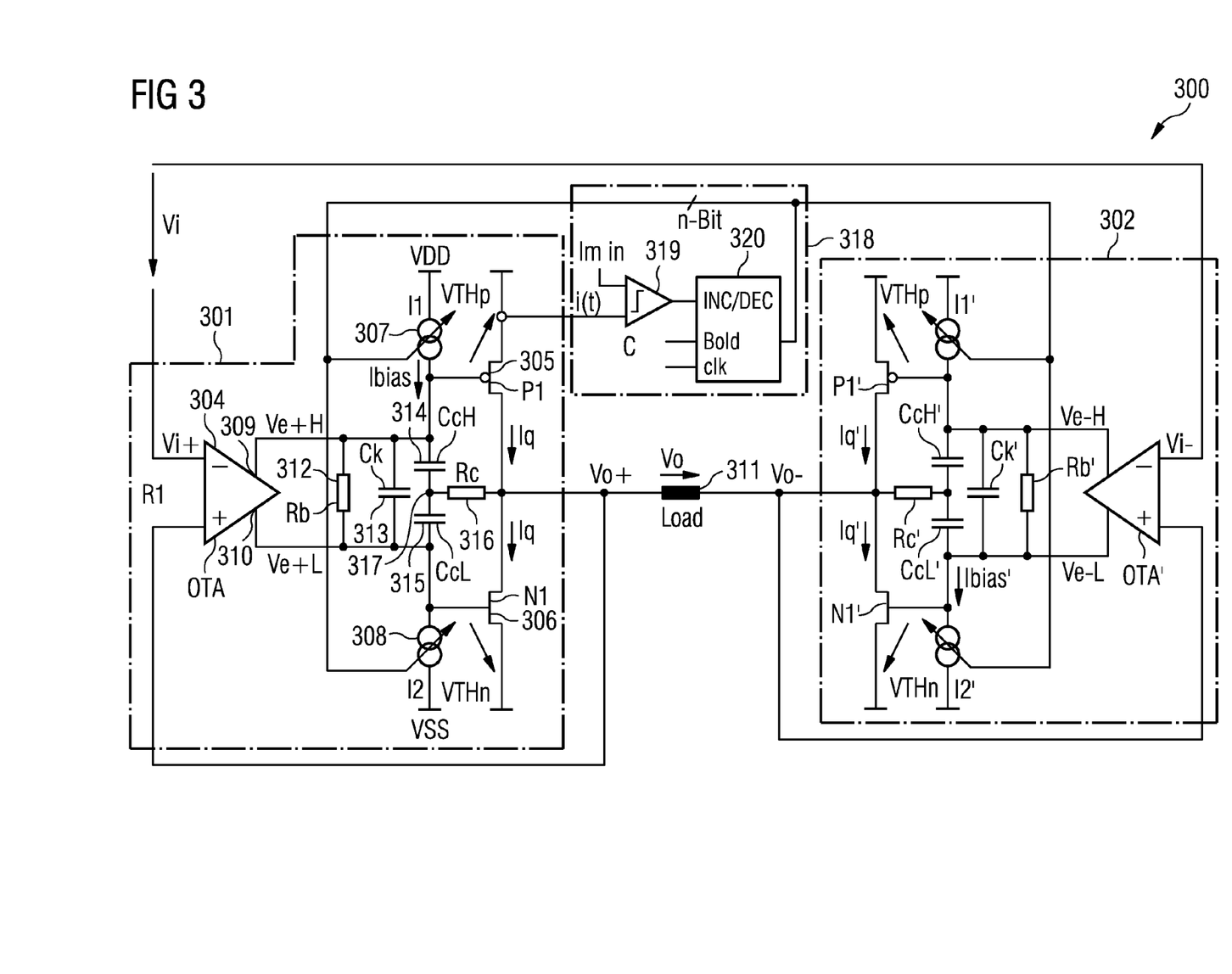
FIG. 3 shows an amplifier circuit according to an embodiment.

FIG. 3 shows an amplifier circuit 300 according to an embodiment.

The amplifier circuit 300 may for example be used as the amplifier circuit for the chip card 200.

The amplifier circuit 300 includes a first single ended amplifier circuit 301 and a second single ended amplifier circuit 302.

The first single ended amplifier circuit 301 includes an input which is supplied with the positive component of a differential input Vi and an output coupled to a load 311.

The second single ended amplifier circuit 302 includes an input which is supplied with the negative component of the differential input Vi and an output coupled to the load 311 such that the load 311 is coupled between the output of the first single ended amplifier circuit 301 and the output of the second single ended amplifier circuit 302.

Since the first single ended amplifier circuit 301 and the second single ended amplifier circuit 302 have a similar structure, only the first single ended amplifier circuit 301 is described in the following.

The first single ended amplifier circuit 301 includes an operational transconductance amplifier (OTA) 304. In this implementation, an OTA 304 is used that has a first output 309 and a second output 310. For example, the first output 309 acts as a current source and the second output 310 acts as a current sink such that the difference between the current supplied by the first output 309 and the current absorbed by the second input 310 is controlled by the voltage difference of the voltage at the positive input and the voltage at the negative input of the OTA 304 (e.g. is proportional to this voltage difference). In other words, for example, the difference between the current supplied by the first output 309 and the current absorbed by the second input 310 may be equal to the current that is output by an OTA that has one output providing a voltage-controlled current. An implementation example of the OTA 304 is given further below with reference to FIG. 5.

The negative input of the OTA 304 is the input (for the signal to be amplified) of the first single ended amplifier circuit 302 and the positive input of the OTA 304 is coupled to the output of the first single ended amplifier circuit 302. The first single ended amplifier circuit 301 further includes an p-channel field effect transistor 305 whose source is coupled to the upper supply potential (i.e. the supply voltage) VDD and whose drain is coupled to the output of the first single ended amplifier circuit 301. The first single ended amplifier circuit 301 further includes an n-channel field effect transistor 306 whose drain is coupled to the output of the first single ended amplifier circuit 301 and whose source is coupled to the lower supply potential VSS.

The first single ended amplifier circuit 301 further includes a first current source 307 which is coupled between VDD and the gate of the p-channel field effect transistor 305 and a second current source 308 which coupled between VSS and the gate of the n-channel field effect transistor 306.

The first output 309 of the OTA 304 is coupled to the gate of the p-channel field effect transistor 305. The second output 310 of the OTA 304 is coupled to the gate of the n-channel field effect transistor 306.

The first single ended amplifier circuit 301 includes a first resistor 312 and a first capacitor 313 which are each coupled between the first output of the OTA 304 and the second output of the OTA 304.

Further, the first single ended amplifier circuit 301 includes a second capacitor 314 coupled between the gate of the p-channel field effect transistor 305 and a node 317, a third capacitor coupled between the gate of the n-channel field effect transistor 306 and the node 317 and a second resistor coupled between the output of the first single ended amplifier circuit 301 and the node 317.

In the following, the potential at the first output (high output) of the OTA 304 is referred to as Ve+H and the potential at the second output (low output) of the OTA 304 is referred to as Ve+L. The corresponding potentials of the second single ended amplifier circuit 302 are analogously referred to as Ve−H and Ve−L.

As the p-channel field effect transistor 305 (e.g. a PMOS device) starts conducting if Ve+H<VDD−VTHp (or Ve−H<VDD−VTHp for the case of the second single ended amplifier circuit 302) and the n-channel field effect transistor NMOS device starts conducting if Ve+L>VSS+VTHn (or Ve+L>VSS+VTHn for the case of the second single ended amplifier circuit 302) the OTA 304 can be directly supplied by VDD without a charge pump needed.

The first single-ended amplifier circuit 301 (and analogously the second single-ended amplifier circuit 302) can provide a rail to rail output voltage range given by VDD−VSATp (high level) and VSS+VSATn (low level) wherein VSATp is the source-drain saturation voltage of the p-channel field effect transistor and VSATPn is the drain-source saturation voltage of the n-channel field effect transistor. This may allow having a sufficient voltage difference (between high level output voltage and low level output voltage), even in case of a low supply voltage.

To minimize the quiescent current Iq in the output stage (formed by the p-channel field effect transistor 305 and the n-channel field effect transistor 306) the voltage Ve+H should be in the range of VDD−VTHp and the voltage Ve+L should be in the range of VSS+VTHn. This state can be reached by varying the voltage drop across the first resistor 312 Rb by controlling the bias current Ibias supplied by the first current source 307 and the second current source 308.

According to one embodiment, the control of the bias current is implemented by a digital control loop which is implemented by a current control circuit 318 of the amplifier circuit 300.

For example, before the amplifier circuit 300 is used in normal operation (e.g. for transmitting a modulated transmit signal by means of a transmit antenna forming the load 311) the quiescent current is calibrated for a certain load- and input voltage-characteristic. For example, the calibration is performed by applying the nominal input voltage (in terms of frequency and amplitude, e.g. applying a nominal carrier signal) at the input of the amplifier circuit 300 (i.e. as Vi).

The current control circuit 318 includes a comparator 319 which is supplied with a measure of the current into the source of the p-channel field effect transistor 305.

The digital control loop adjusts the voltage drop across the first resistor 312 by controlling the current sources 307, 308 by means of a controller 320 which receives the comparison result from the comparator 319 in such a way so that the minimum of the load current i(t) sensed by the comparator 319 matches to a reference current Imin supplied to the comparator 319. The maximum quiescent current Iq is equivalent to the minimum of the load current i(t) and should be as small as possible for maximizing the efficiency of the amplifier circuit 300, but large enough to avoid signal distortion. The current information i(t) is sampled in only one of the two single-ended amplifier circuits 301, 302 (in this example the first single-ended amplifier circuit 301) by the control loop as both two single-ended amplifier circuits 301, 302 are symmetrically aligned and thermally well coupled.

The second capacitor 314, the third capacitor 315 and the second resistor 316 form a pole zero compensation circuit which ensures the stability of the first single-ended amplifier circuit 301.

The first capacitor 313 ac-couples the outputs of the OTA 304 for minimizing signal distortion.

Figure 4A:
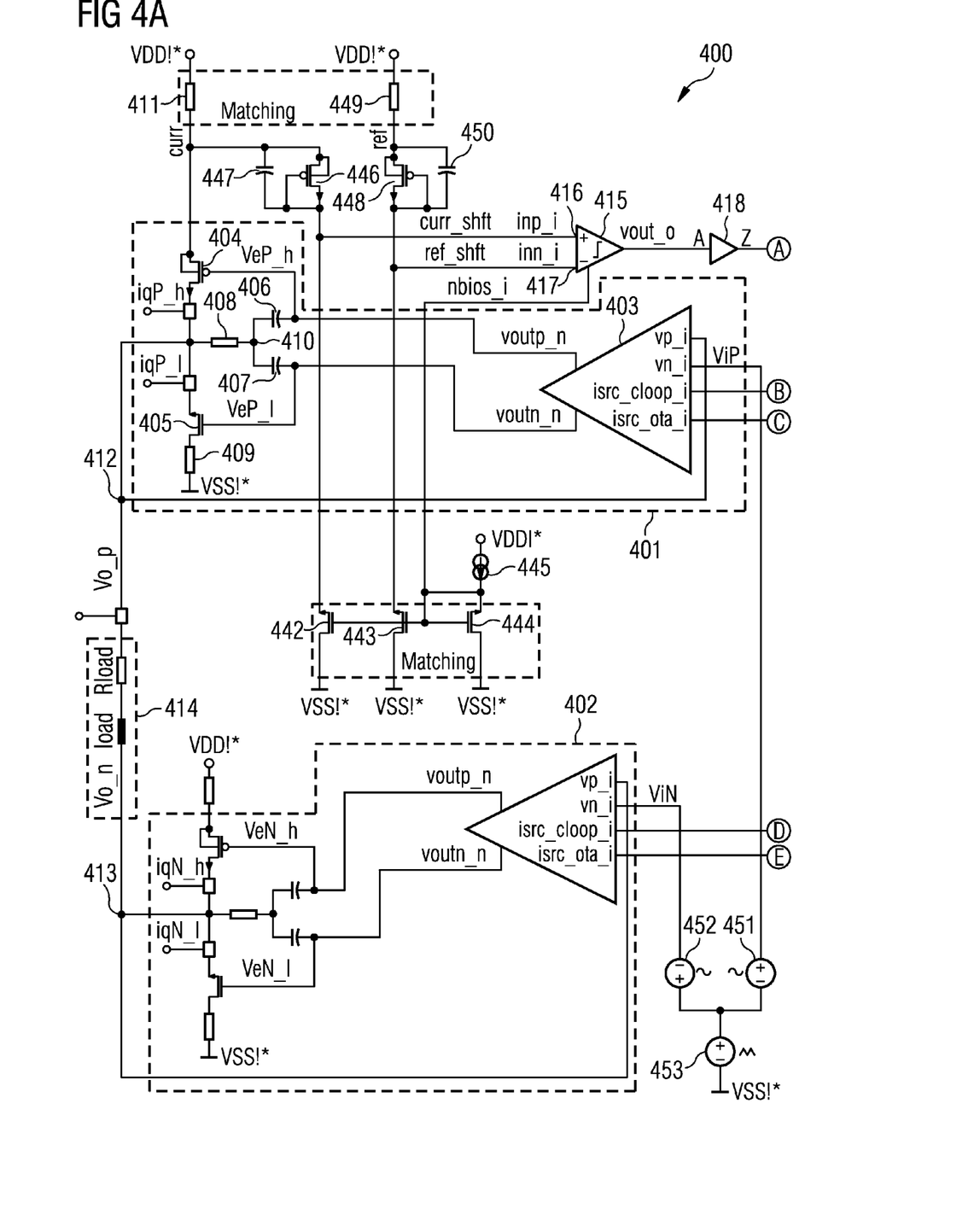
FIGS. 4A and 4B show an amplifier circuit according to an embodiment.
Figure 4B:
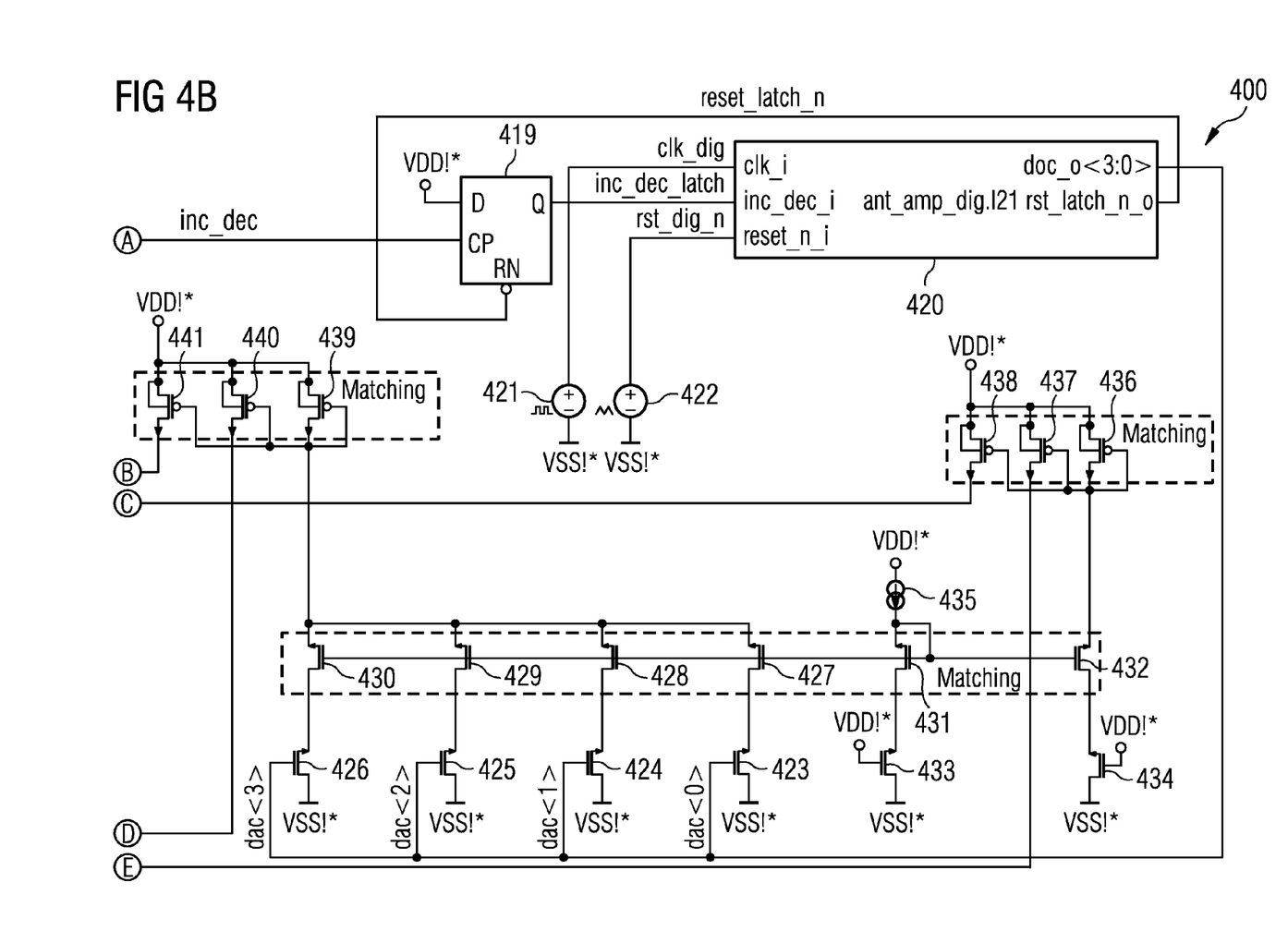

An implementation example is shown in FIG. 4, which is separated into FIG. 4A (left hand side of circuit) and FIG. 4B (right hand side of circuit) wherein the connection points between the part of the circuit shown in FIG. 4A and the part of the circuit shown in FIG. 4B are labeled A to E.

FIGS. 4A and 4B show an amplifier circuit 400 according to an embodiment.

The amplifier circuit 400 includes a first single ended amplifier circuit 401 and a second single ended amplifier circuit 402. The first single ended amplifier circuit 401 and a second single ended amplifier circuit 402 have similar structure. Therefore, only the first single ended amplifier circuit 401 is described in the following.

The first single ended amplifier circuit 401 and the second single ended amplifier circuit 402 act as single ended complementary amplifiers circuits amplifying the input signal Vi equal to the difference of Vi+ and Vi− (referred to as ViP and ViN in FIG. 4) and generating the output signal Vo which is equal to the difference of Vo+ and Vo− (referred to as Vo_p and Vo_n in FIG. 4).

The first single ended amplifier circuit 401 includes an OTA 403, a first PMOS 404, a first NMOS 405, a first capacitor 406, a second capacitor 407, a first resistor 408 and a second resistor 409. The first capacitor 406 is coupled between a first output (high output) of the OTA 403 and a first node 410. The second capacitor 407 is coupled between a second output (low output) of the OTA 403 and the first node 410. The first output of the OTA 403 is further coupled to the gate of the first PMOS 404 and the second output of the OTA 403 is further coupled to the gate of the first NMOS 405. The source of the first NMOS 405 is connected to VSS via the second resistor 409 and the source of the first PMOS 404 is connected to VDD (in this example VDD=1.35V) via a third resistor 411 of the amplifier circuit 410. The drain of the first PMOS 404 and the drain of the first NMOS are connected to a first output 412 (high output) of the amplifier circuit 400. The second single-ended amplifier circuit 402 is correspondingly coupled to a second output 413 (low output) of the amplifier circuit 400 and a load 414 is coupled between the first output 413 and the second output 414. In this example, the load 414 is an ohmic-inductive driver load of 1.9 Ohm and 430 nH.

The first resistor 408 is connected between the first node 410 and the first output 412.

The remaining components of the amplifier circuit 400 shown in FIGS. 4A and 4B (not yet described) can be seen to implement a quiescent current control loop. The control loop includes a comparator 415 which has a first input 416 and a second input 417 and provides a signal representing the result of the comparison to a buffer gate 418. The output of the buffer gate 418 is coupled to the clock input of a d flip flop 419 whose D input is coupled to VDD and whose Q output is coupled to a counter circuit 420 to indicate whether the counter circuit 420 should increment or decrement its counter value. A clock input of the counter circuit 420 is supplied with a clock signal from a clock generator 421. A reset input of the counter circuit 420 is coupled to a reset circuit 422 which may reset the counter value. The counter circuit 420 further has a reset output coupled to the reset input of the d-flip-flop 419. The counter circuit 420 outputs the current counter value as a digital value of for example 4 bits (numbered 0 to 3) wherein bit 0 is supplied to the gate of a second NMOS 423, bit 1 is supplied to the gate of a third NMOS 424, bit 2 is supplied to the gate of a fourth NMOS 425 and bit 3 is supplied to the gate of a fifth NMOS 426. The sources of the second NMOS 423, the third NMOS 424, the fourth NMOS 425 and the fifth NMOS 426 are coupled to VSS. The drain of the second NMOS 423 is coupled to the source of a sixth NMOS 427, the drain of the third NMOS 424 is coupled to the source of a seventh NMOS 428, the drain of the fourth NMOS 425 is coupled to the source of an eighth NMOS 428, and the drain of the third NMOS 426 is coupled to the source of a seventh NMOS 430.

The gates of the sixth NMOS 427, the seventh NMOS 428, the eighth NMOS 429 and the ninth NMOS 430 are coupled to the gate of a tenth NMOS 431 and to the gate of an eleventh NMOS 432.

The source of the tenth NMOS 431 is coupled to the drain of a twelfth NMOS 433 whose source is coupled to VSS and whose gate is coupled to VDD.

The source of the eleventh NMOS 432 is coupled to the drain of a 13th NMOS 434 whose source is coupled to VSS and whose gate is coupled to VDD.

The gate of the tenth NMOS 443 is coupled to the drain of the tenth NMOS 443. Further, the drain of the tenth NMOS 443 is coupled by means of a first current source 435 to VDD.

The drain of the eleventh NMOS 432 is coupled to the gates of a second PMOS 436, a third PMOS 437 and a fourth PMOS 438. The sources of the second PMOS 436, the third PMOS 437 and the fourth PMOS 438 are coupled to VDD. The drain of the second PMOS 436 is coupled to the drain of the eleventh NMOS 432. The drain of the third PMOS 437 is coupled to the bias current (denoted irc_ota_i) input of the OTA of the second single-ended amplifier circuit 402. The drain of the fourth PMOS 438 is coupled to the bias current of the OTA 403 of the first single-ended amplifier circuit 401.

The drains of the sixth NMOS 427, the seventh NMOS 428, the eighth NMOS 429 and the ninth NMOS 430 are coupled to the gates of a fifth PMOS 439, a sixth PMOS 440 and a seventh PMOS 441. The sources of the fifth PMOS 439, the sixth PMOS 440 and the seventh PMOS 441 are coupled to VDD.

The drain of the fifth PMOS 439 is coupled to the drains of the sixth NMOS 427, the seventh NMOS 428, the eighth NMOS 429 and the ninth NMOS 430.

The drain of the sixth PMOS 440 is coupled to the quiescent current control current (denoted irc_cloop_i) input of the OTA of the second single-ended amplifier circuit 402. The drain of the seventh PMOS 441 is coupled to the quiescent current control current input of the OTA 403 of the first single-ended amplifier circuit 401.

The first input 416 of the comparator 415 is coupled to the drain of a 14th NMOS 442 whose source is connected to VSS. The second input 417 of the comparator 415 is coupled to the drain of a 15th NMOS 443 whose source is connected to VSS.

The gate of the 15th NMOS 442 and the gate of the 16th NMOS 443 are coupled to a 16th NMOS 444 whose drain is connected to its gate and via a second current source 445 to VDD.

The gate of the 15th NMOS 442 is further coupled to a bias input of the comparator 415.

The first input 416 of the comparator 415 is further coupled to the drain of an eighth PMOS 446 whose source is coupled by means of the third resistor 411 to VDD and whose gate is coupled by means of a third capacitor 447 to its drain.

The second input 417 of the comparator 415 is further coupled to the drain of an ninth PMOS 448 whose source is coupled by means of a fourth resistor 449 to VDD and whose gate is coupled by means of a fourth capacitor 450 to its drain.

As input to the amplifier circuit 200, the negative input of the OTA of the first single ended amplifier circuit 401 is supplied with a signal by a first oscillator 451 and The negative input of the OTA of the second single ended amplifier circuit 402 is supplied with a signal by a second oscillator 452. The first oscillator 451 and the second oscillator 452 are coupled to VSS via a DC voltage source 453. The first oscillator 451 provides the positive component ViP of the differential input to the amplifier circuit 400 and the second oscillator 452 provides the negative component ViN of the differential input to the amplifier circuit 400. For example, the first oscillator 451 and the second oscillator 452 provide the carrier signal (the signal stimuli e.g. with frequency f=13.56 MHz and amplitude Vi+=500 mV+/−200 mV, Vi−=500 mV−/+200 mV) which may be modulated in terms of amplitude, phase or frequency for transmission.

The first single ended complementary amplifier stage 401 is implemented by the first PMOS 404, the first NMOS 405 and the OTA 403 (amplifying ViP) wherein the PMOS 404 and the first NMOS 405 form the push-pull stage of the amplifier stage 401. The second single ended complementary amplifier stage 402 is similarly implemented by a PMOS, an NMOS and an OTA and amplifying ViN). The OTA 403 of the first single ended amplifier circuit 401 and the OTA of the second single ended amplifier circuit 402 are biased by constant current by the third PMOS 437 and the fourth PMOS 438 acting as current sources.

The quiescent current control minimizes the quiescent current iqP=iqP_h−iqP_l in the first single ended complementary amplifier stage 401 and iqN=iqN_h−iqN_l in the second single ended complementary amplifier stage 402 by controlling the minimum value of iqP_h and iqN_h in a way to match a defined reference value. As the complementary amplifiers stages 401, 402 are symmetrical the control loop only samples the current iqP_h in the first amplifier stage 401 (amplifying ViP) and uses this information for minimizing the quiescent current in both amplifier stages 401, 402. The current iqP_h is converted into a voltage by the third resistor 411, level shifted by the eighth PMOS 446 acting as diode and represented by the signal curr_shft. A current reference signal ref_shft is generated by the voltage drop across the fourth resistor 449 and level shifted by the ninth PMOS 448 acting as diode. The third resistor 411 and the fourth resistor 449 and the eighth PMOS 446 and the ninth PMOS 448 are matched. The second resistor 409 and the resistors of the second single ended amplifier stage 402 corresponding to the second resistor 409 and the third resistor 411 have been added to the complementary amplifier stages 401, 402 for maintaining circuit symmetry.

If the signal curr_shft matches the reference signal ref_shft, the current iqP_h can be calculated by multiplying the current provided by the second current source by the ratio of the fourth resistor 411 to the fourth resistor 449, in this example iqP_h=1 uA*5 k/10R=500 uA (wherein uA denotes microampere). As long as the voltage of the signal curr_shft is larger than the voltage of the signal ref_shft (means iqP_h is larger than 500 uA) the signal inc_dec generated by the comparator 415 is high. The signal inc_dec is sampled by the flip-flop 419 and controls the 4 bit counter 420. The binary value of the counter 420 is represented by the signal dac<3:0> and increases as long as the signal inc_dec stays high (means iqP_h is larger than 500 uA). The signal dac<3:0> controls the binary weighted current source formed by the sixth to ninth NMOS transistors 427 to 430 generating the current isrc_cloop delivered to the error amplifiers (i.e. the OTAs of the amplifier stages 401, 402) via the sixth PMOS 440 and the seventh PMOS 441 acting as current sources. If the binary value of the signal dac<3:0> increases the current signal isrc_cloop increases and vice versa. The current signal isrc_cloop controls the static voltage difference between signals VeP_h and VeP_l and VeN_h and VeN_l, respectively, and thus controls the quiescent current in each single ended amplifier stage. If the signal curr_shft is equal or slightly below the reference signal ref_shft (means iqP_h is equal or smaller than 500 uA) the signal inc_dec gets low and the counter 420 holds its binary output value. In this case the quiescent current calibration is finished as the minimum current into each of the two complementary amplifier stages equals to 500 uA (the value defined by the reference signal ref_shft). Therefore the quiescent current in each amplifier stage 401, 402 is minimized for a certain load impedance and input signal characteristic (frequency, amplitude) guaranteeing best circuit efficiency for these parameters.

To maintain stability of each amplifier stage 401, 402 a symmetrical pole zero compensation structure has been added to the circuit (first resistor 408, first capacitor 406 and second capacitor 407 for the first amplifier stage 401 and analogously for the second amplifier stage 402). This kind of compensation works well with ohmic/inductive amplifier loads as it is the case for driving an antenna.

The error amplifiers, i.e. the OTA 403 of the first amplifier stage 401 and the OTA of the second amplifier stage 402, are each for example implemented by a fully symmetrical OTA structure. This is illustrated in FIG. 5.

Figure 5:
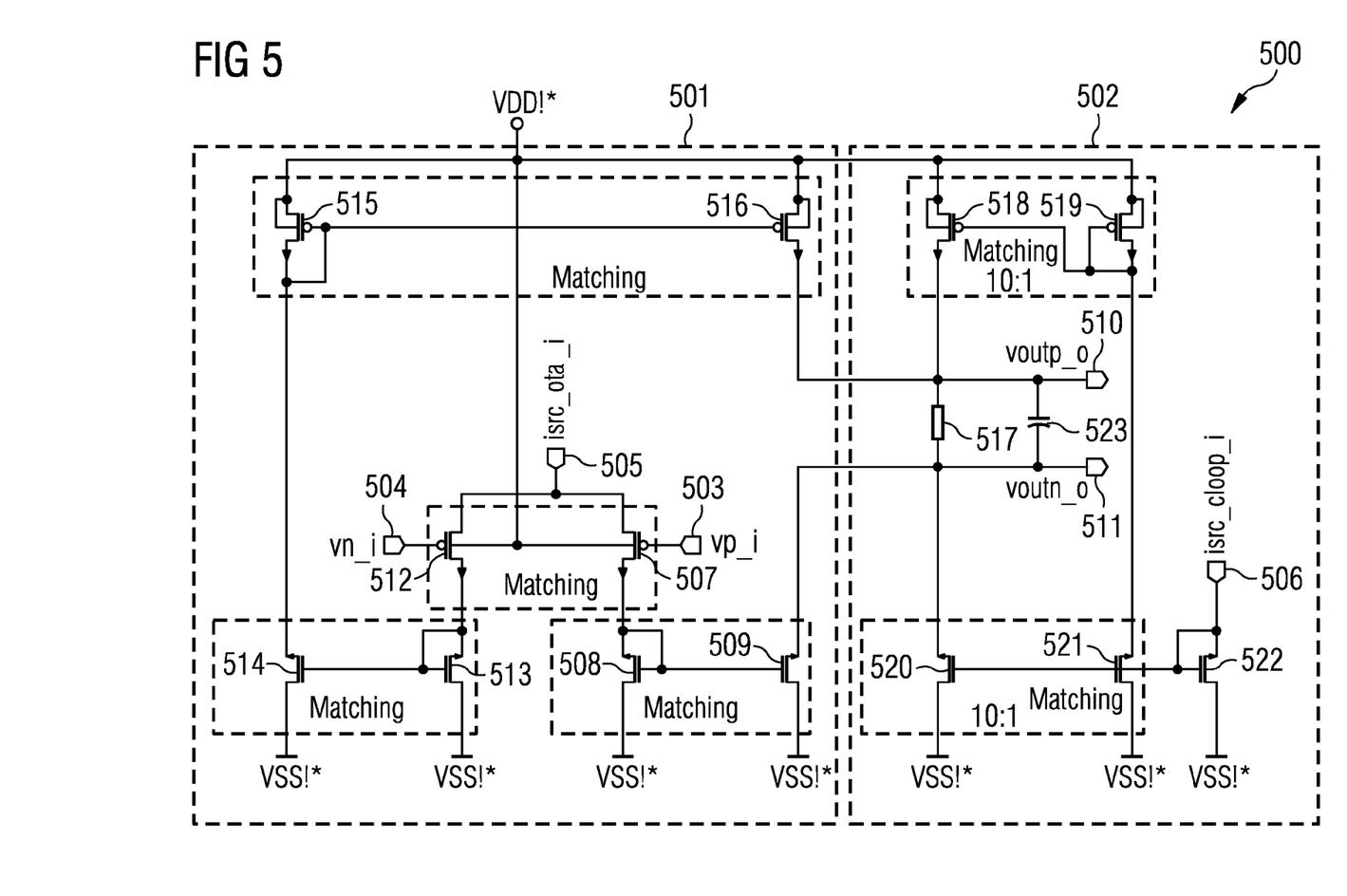
FIG. 5 shows an error amplifier according to an embodiment.

FIG. 5 shows an error amplifier 500 according to an embodiment.

The error amplifier 500 can be seen to include a symmetrical OTA structure 501 and a quiescent current adjust structure 502.

The error amplifier 500 amplifies the difference between the voltage at a first input 503 (positive input) and a second input 504 (negative input). The error amplifier 500 further includes a bias current input 505 and a quiescent current control current input 506. The amplifier circuit 500 further includes a first output (positive output) 510 (acting as current source) and a second output (negative output) 511 (acting as current sink).

The first input 503 is coupled to a first PMOS 507 whose source is coupled to the bias current input 505 and whose drain is coupled to the drain of a first NMOS 508 whose source is coupled to VSS and whose gate is coupled to its drain as well as to the gate of a second NMOS 509. The source of the second NMOS 509 is coupled to VSS and its drain is coupled to the second output 511.

The second input 504 is coupled to a second PMOS 512 whose source is coupled to the bias current input 505 and whose drain is coupled to the drain of a third NMOS 513 whose source is coupled to VSS and whose gate is coupled to its drain as well as to the gate of a fourth NMOS 514. The source of the fourth NMOS 514 is coupled to VSS and the drain of the fourth NMOS 514 is coupled to the drain of a third PMOS 515 whose source is coupled to VDD and whose gate is coupled to its drain and coupled to the gate of a fourth PMOS 516 whose source is coupled to VDD and whose drain is coupled to the first output 510.

The first output 510 and the second output 511 are coupled by means of a resistor 517 and by means of a capacitor 523.

The first output 510 is further coupled to the drain of a fifth PMOS 518 whose source is coupled to VDD and whose gate is coupled to the gate of a sixth PMOS 519 whose source is coupled to VDD and whose drain is coupled to its gate.

The second output 511 is further coupled to the drain of a fifth NMOS 520 whose source is coupled to VSS and whose gate is coupled to the gate of a sixth NMOS 521 whose source is coupled to VSS and whose drain is coupled to the drain of the sixth PMOS 519.

The gates of the fifth NMOS 520 and the sixth NMOS 521 are further coupled to the gate of a seventh NMOS 522 whose gate is further coupled to its drain, whose source is coupled to VSS and whose drain is coupled to the quiescent current control current input 506.

The voltage drop across the resistor 517 is equivalent to the static voltage difference between the voltage at the positive input 504 and the voltage at the negative input 504 and therefore defines the quiescent current in the single ended complementary amplifier stages 401, 402. The voltage drop and therefore the quiescent current is controlled by the bias current signal isrc_cloop_i generated by the quiescent current control loop described above.

It should be noted that in the above circuits 400, 500, the bulks of PMOS transistors may be coupled to VDD.

Figures 6, 6A:
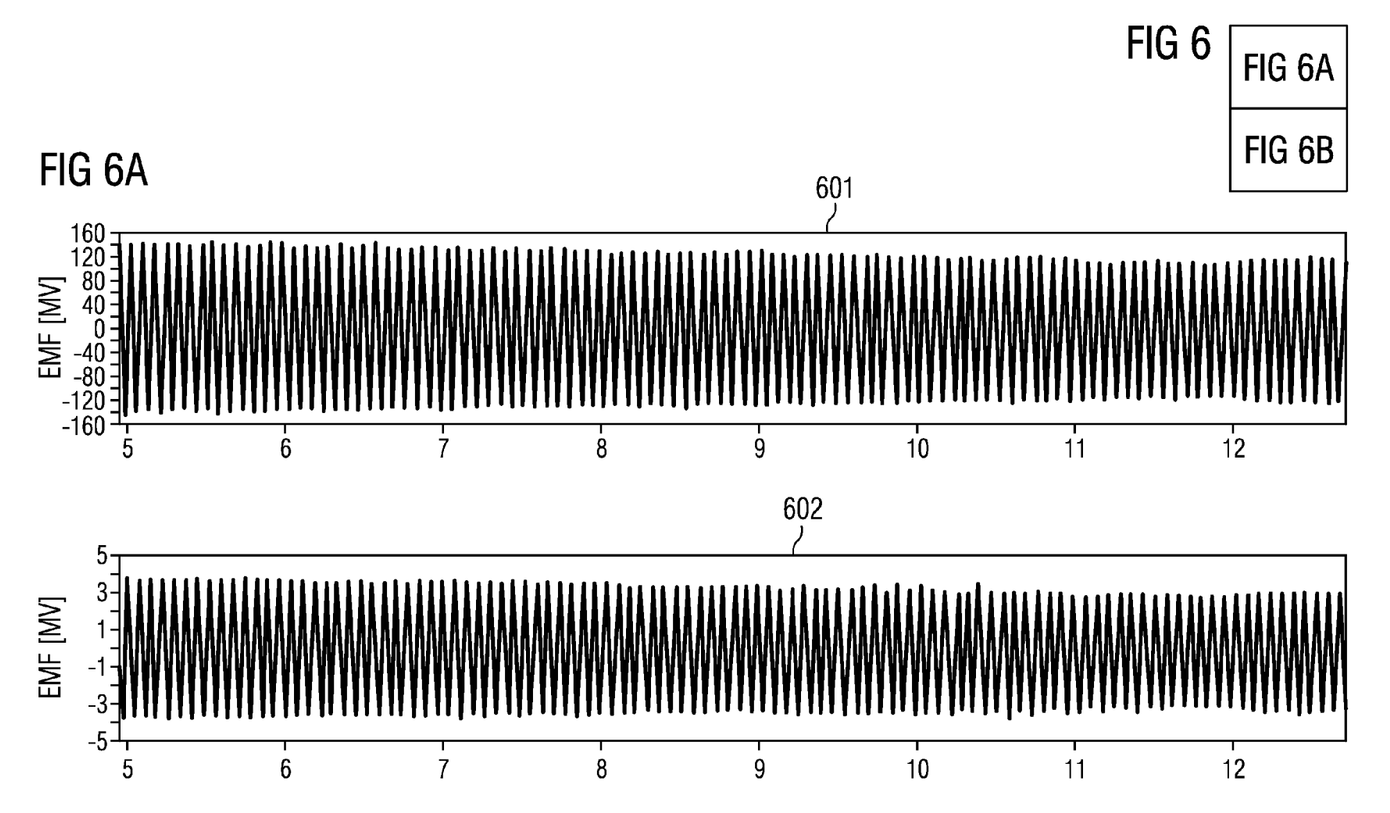
FIGS. 6A and 6B show five diagrams illustrating a quiescent current calibration.

A simulation result showing the behavior of the amplifier circuit 400 illustrated in FIG. 4 in quiescent current calibration mode is shown in FIG. 6.

Figure 6B:
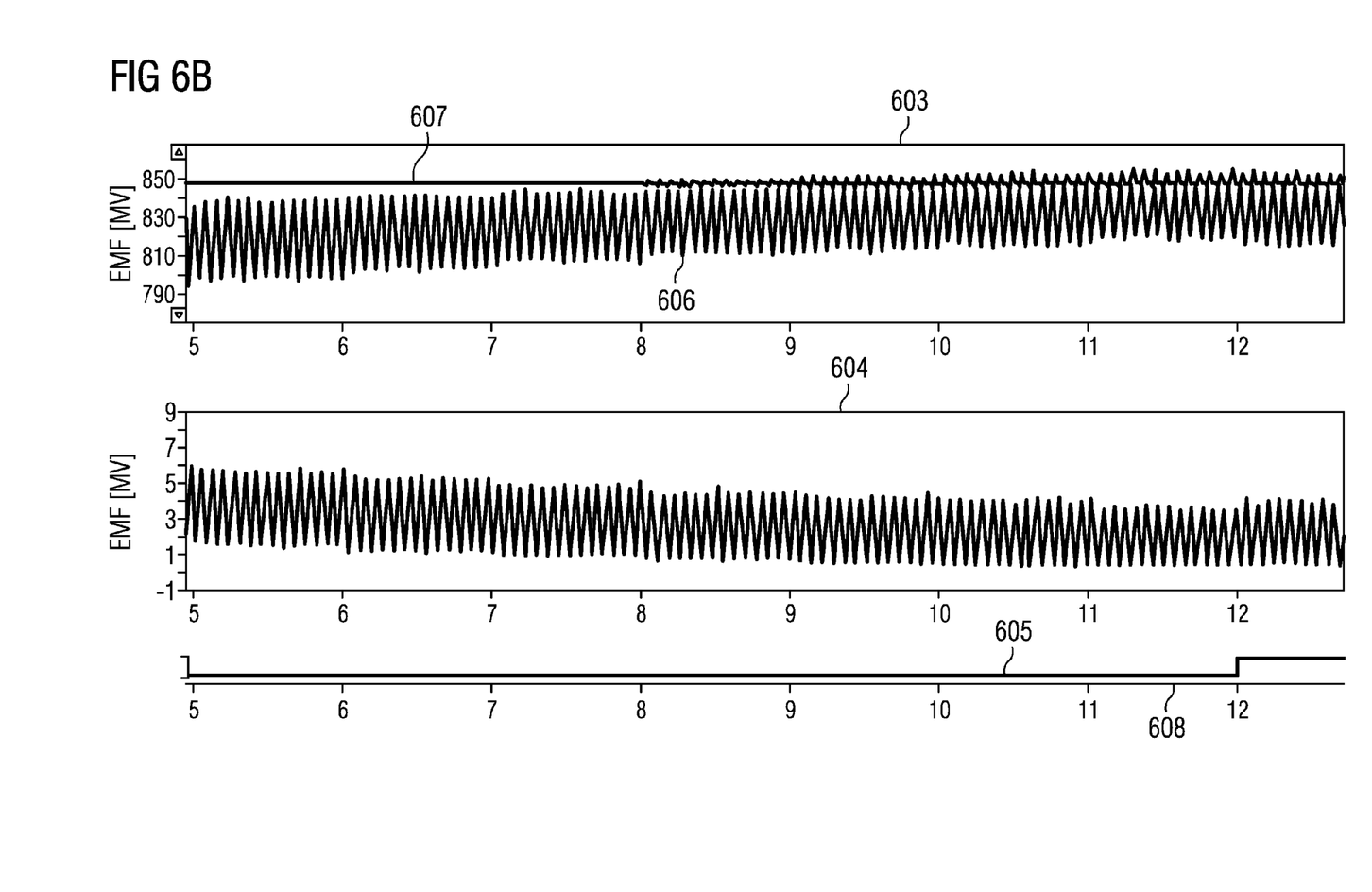

FIG. 6 shows five diagrams 601, 602, 603, 604, 605 illustrating a quiescent current calibration.

The first diagram 601 illustrates the output voltage at the load 414.

The second diagram 602 illustrates the current through the load 414.

The third diagram shows the values of the signals curr-shft 606 and ref-shft 607 (constant value) supplied to the comparator 415.

The fourth diagram 604 shows the high quiescent current component iqp_h (i.e. the quiescent current through the PMOS of the push-pull stage of the amplifier stage 401, 402).

The fifth diagram 605 illustrates a signal cal_done which indicates whether the calibration is completed (high value) or not (low value).

Time increases from left to right along a time axis 608 which is valid for all diagrams 601 to 605.

The control loop limits the maximum quiescent current to about 500 uA. The quiescent current calibration phase is active (cal_done low) as long the minimum value of the current iqP_h is larger than 500 uA (in this case the signal curr_shft is smaller as the reference signal ref_shft).

Figures 7, 7A:
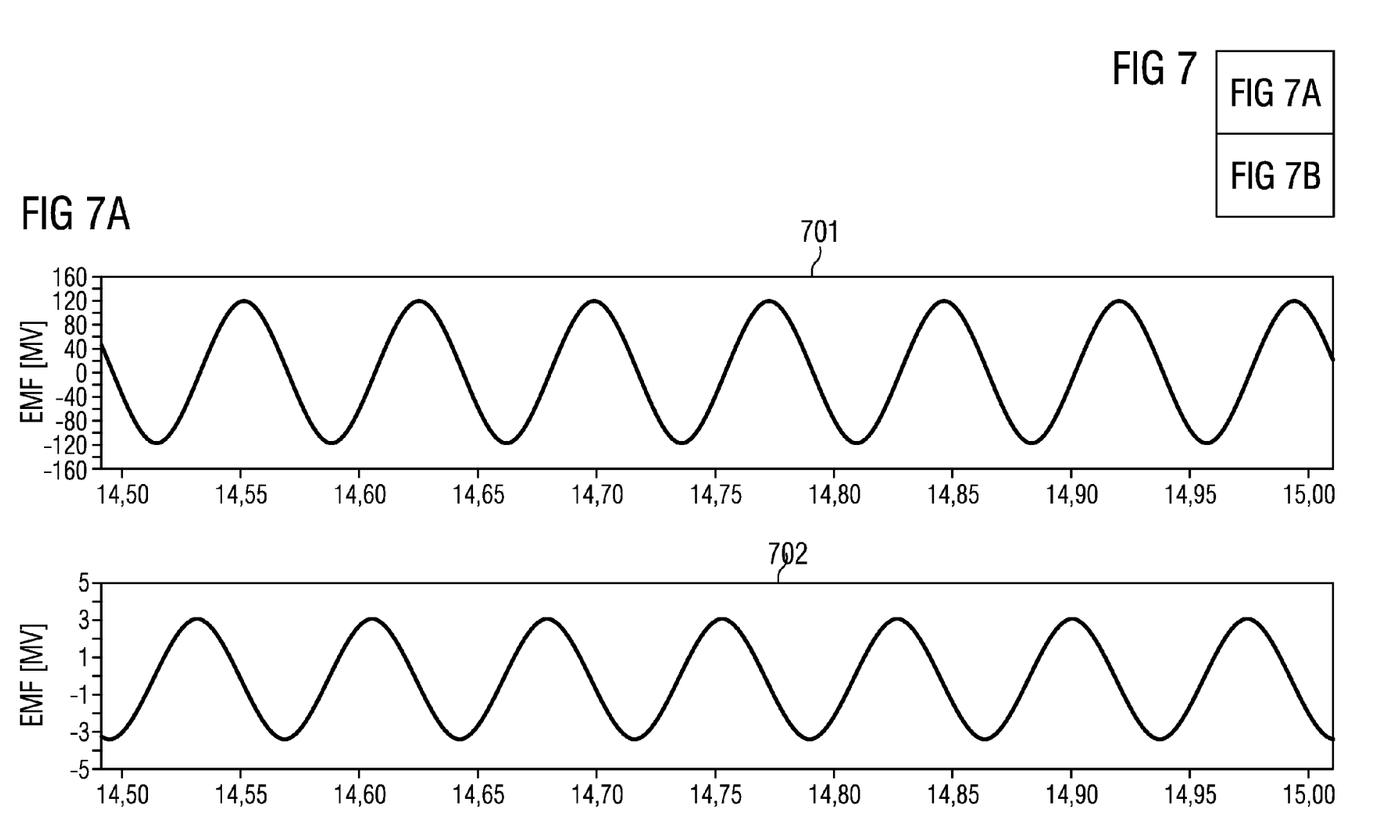
FIGS. 7A and 7B show five diagrams illustrating steady state behavior of the amplifier circuit shown in FIG. 4.

The behavior of the amplifier circuit 400 illustrated in FIG. 4 in steady state is illustrated in FIG. 7.

Figure 7B:
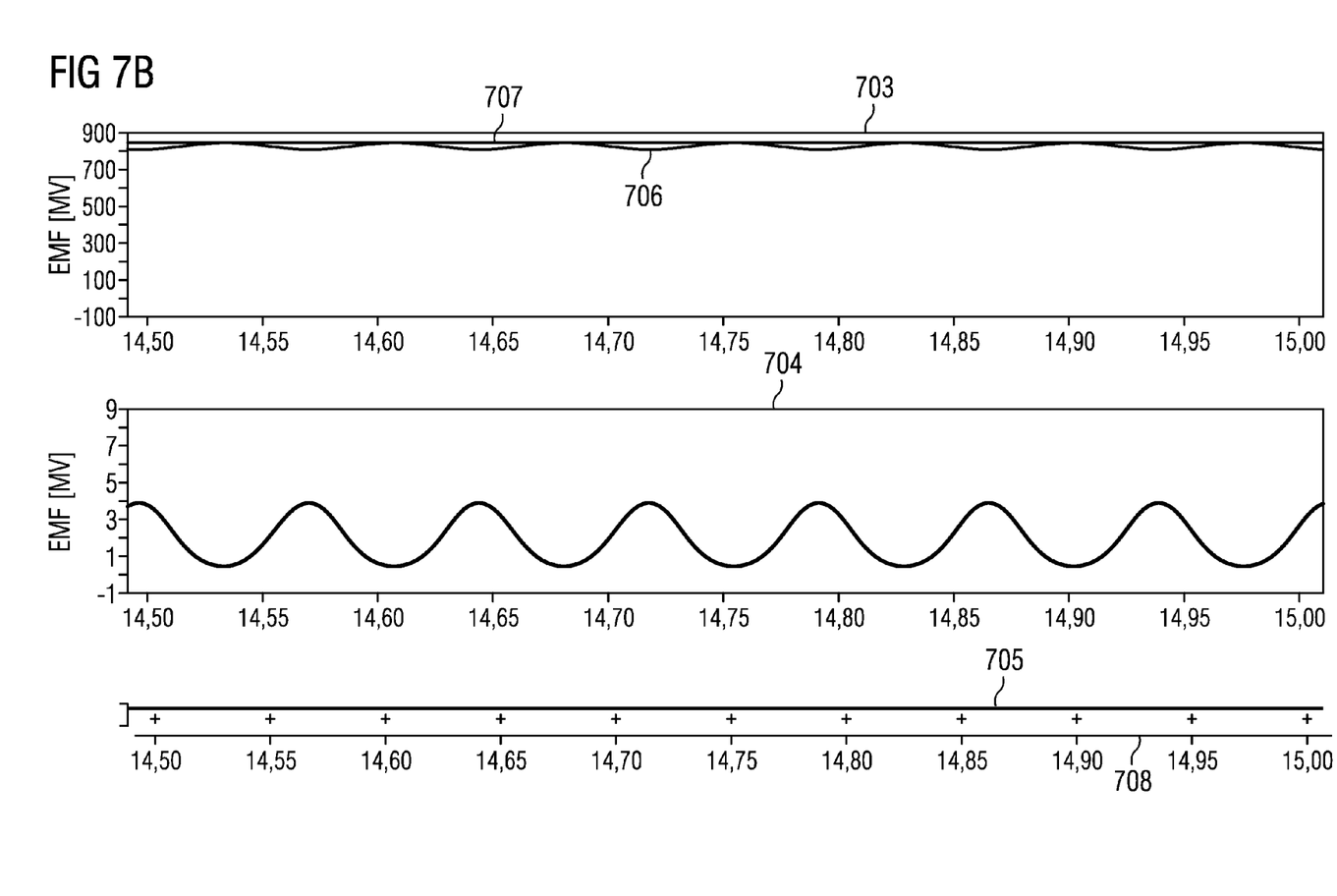

FIG. 7 shows five diagrams 701, 702, 703, 704, 705 illustrating steady state behavior of the amplifier circuit 400.

The first diagram 701 illustrates the output voltage at the load 414.

The second diagram 702 illustrates the current through the load 414.

The third diagram shows the values of the signals curr-shft 706 and ref-shft 707 (constant value) supplied to the comparator 415.

The fourth diagram 704 shows the high quiescent current component iqp_h. It should be noted that the low quiescent current component iqp_l (i.e. the quiescent current through the NMOS of the push-pull stage of the amplifier stage 401, 402) has a similar graph as iqp_h but phase shifted by 180°.

The fifth diagram 705 illustrates a signal cal_done which indicates whether the calibration is completed (high value) or not (low value). In this case, it is assumed that calibration has been done and the signal cal_done is on high value.

Time increases from left to right along a time axis 708 which is valid for all diagrams 701 to 705.

The simulation result of the steady state illustrated in FIG. 7 shows the sinusoidal output voltage (first diagram 701) and output current (second diagram 702). It also shows that the minimum value of the current iqP_h is at about 500 uA as intended by the quiescent current control loop.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:
1. A chip card comprising:
a signal source configured to generate a signal to be transmitted via radio;
a p-channel field effect transistor having a gate terminal, a source terminal and a drain terminal and being coupled with its source terminal to an upper supply potential and with its drain terminal to a common node;

an n-channel field effect transistor having a gate terminal, a source terminal and a drain terminal and being coupled with its drain terminal to the common node and with its source terminal to a lower supply potential;

an operational amplifier having a positive input terminal, a negative input terminal and an output terminal, wherein the positive input terminal is coupled to the common node, the negative input terminal is coupled to the signal source and the output terminal is coupled to the gate terminal of the p-channel field effect transistor and to the gate terminal of the n-channel field effect transistor; and an antenna coupled to the common node, wherein the operational amplifier, the p-channel field effect transistor and the n-channel field effect transistor form a first amplifier stage and the chip card comprises a second amplifier stage.

2. The chip card of claim 1, wherein the operational amplifier is an operational transconductance amplifier.

3. The chip card of claim 1, wherein the gate of the p-channel field effect transistors and the gate of the n-channel field effect transistor are coupled by at least one of a resistor and a capacitor.

4. The chip card of claim 1, further comprising a pole-zero compensation circuit coupled between the gate of the p-channel field effect transistor, the gate of the n-channel field effect transistor and the common node.

5. The chip card of claim 1, wherein the second amplifier stage comprises a further p-channel field effect transistor having a gate terminal, a source terminal and a drain terminal and being coupled with its source terminal to the upper supply potential and with its drain terminal to a further common node;

a further n-channel field effect transistor having a gate terminal, a source terminal and a drain terminal and being coupled with its drain terminal to the further common node and with its source terminal to the lower supply potential;

a further operational amplifier having a positive input terminal, a negative input terminal and an output terminal, wherein the positive input terminal is coupled to the further common node, the negative input terminal is coupled to the signal source and the output terminal is coupled to the gate terminal of the further p-channel field effect transistor and coupled to the gate terminal of the further n-channel field effect transistor;

wherein the antenna is coupled to the further common node.

6. The chip card of claim 5, wherein the antenna is coupled between the common node and the further common node.

7. The chip card of claim 5, wherein the signal is a differential signal and wherein the signal source is configured to supply a positive component of the signal to the negative input of the operational amplifier and to supply a negative component of the signal to the negative input of the further operational amplifier.

8. The chip card of claim 1, further comprising a first bias current source coupled between the higher supply potential and the gate of the p-channel field effect transistor and a second bias current source coupled between the lower supply potential and the gate of the n-channel field effect transistor.

9. The chip card of claim 8, further comprising a quiescent current controller configured to control the first bias current source and the second bias current source based on a quiescent current reduction criterion.

10. The chip card of claim 9, wherein the quiescent current controller is configured to determine the quiescent current through the p-channel field effect transistor and the n-channel field effect transistor and to control the first bias current source and the second bias current source based on the determined quiescent current.

11. The chip card of claim 10, wherein the quiescent current controller is configured to control the first bias current source and the second bias current source based on a comparison of the determined quiescent current and a current reference.

12. The chip card of claim 11, wherein the quiescent current controller is configured to determine a magnitude of the current to be supplied by the first bias current source and the second bias current source based on the result of the comparison.

13. The chip card of claim 9, wherein the chip card is configured to operate in a calibration mode in which the quiescent current controller determines the magnitude of the current to be supplied by the first bias current source and the second bias current source and is configured to switch, after the determination of the magnitude of the current to be supplied by the first bias current source and the second bias current source, to an amplifying mode in which the quiescent current controller controls the first bias current source and the second bias current source to provide the current of the determined magnitude.

* * * * *